(12) United States Patent
Kakimoto et al.

(10) Patent No.: US 6,333,552 B1
(45) Date of Patent: Dec. 25, 2001

(54) MILLIMETER WAVE SEMICONDUCTOR DEVICE

(75) Inventors: Noriko Kakimoto; Eiji Suematsu, both of Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/368,430

(22) Filed: Aug. 5, 1999

(30) Foreign Application Priority Data

Aug. 7, 1998 (JP) .................................................. 10-223848

(51) Int. Cl.[7] .............................. H01L 23/04; H01L 23/06
(52) U.S. Cl. ........................ 257/728; 257/678; 257/729; 257/730
(58) Field of Search ................................... 257/678, 728, 257/729, 730

(56) References Cited

U.S. PATENT DOCUMENTS

| | | | |
|---|---|---|---|
| 3,828,228 | * 8/1974 | Wong et al. | 257/705 |
| 4,713,634 | 12/1987 | Yamamura | 333/245 |
| 4,967,315 | * 10/1990 | Schelhorn | 361/818 |
| 5,030,935 | * 7/1991 | Williams et al. | 333/246 |
| 5,235,300 | * 8/1993 | Chan et al. | 333/247 |
| 5,712,602 | 1/1998 | Suematsu | 332/127 |
| 5,832,598 | * 11/1998 | Greenman et al. | 29/840 |

FOREIGN PATENT DOCUMENTS

| | | |
|---|---|---|
| 0785557A | 7/1997 | (EP) . |
| 2758908 | 7/1998 | (FR) . |
| A818001 | 1/1996 | (JP) . |
| A1079623 | 3/1998 | (JP) . |

* cited by examiner

*Primary Examiner*—Allan R. Wilson

(57) ABSTRACT

A millimeter wave semiconductor device is comprised of a millimeter wave device, a wiring substrate with the millimeter wave device mounted thereto, and a sealing cap with a conductor on a surface thereof for sealing the millimeter wave device. The sealing cap has a ground potential at the conductor provided on the surface thereof and the sealing cap has an internal surface spaced from an upper surface of the wiring substrate by less than one fourth of a spatial wavelength of a frequency applied. This can prevent creation of a waveguide mode in a sealed space and as a result provide a miniature millimeter wave semiconductor device which can have good RF characteristics in a space sealed by a conductive cap for electromagnetic shielding and can also readily be applied to a variety of packages associated with various product types.

2 Claims, 5 Drawing Sheets

MILLIMETER WAVE SEMICONDUCTOR DEVICE

BACKGROUND OF THE INVENTION

1. Field of the Invention

The present invention relates to millimeter wave semiconductor devices used in a range of equal to or higher than the millimeter wave range.

2. Description of the Background Art

With the recent improvement and enhancement of information processing devices in speed, and image processing devices in resolution, there has been noted high-speed, large-capacity personal communications at radio frequencies such as a millimeter wave band having frequencies of 30 to 300 GHz, a centimetric-wave band or a quasi-millimeter wave band having frequencies close to 30 to 300 GHz.

For such communications it is necessary to make the most use of characteristics of radio waves as well as create a package adapted for radio frequencies which can be small in size and produced at reduced cost and which also require only a short period of time for development.

In general, radio-frequency (RF) packages tend to require sealing in view of the following three points: reduction of influences of unnecessary electromagnetic waves, maintenance of airtightness, and mechanical sealing. RF packages are mechanically sealed for the same reasons as general semiconductor packages. Sealing RF packages to maintain their airtightness is necessary because RF semiconductor chips in general tend to affect RF characteristics when humidity, temperature and the like vary.

To reduce influences of unnecessary electromagnetic waves, a factor which would not be considered for RF packages for relatively low frequencies such as mobile phones, Personal Handy-Phone System (PHS) is crucial in designing RF packages for millimeter wave frequencies and frequencies close thereto.

More specifically, in a millimeter wave-band range, a wavelength is 1 to 10 millimeters long in the atmosphere, and an effective wavelength would be approximately 100 microns to several millimeters when the dielectric constant of a material forming a package is taken into consideration. Since this length corresponds to a scale for a size of a RF semiconductor chip, a package or a RF circuit, its three-dimensional geometry and material properties such as dielectric constant, dielectric loss, significantly affect RF characteristics of the RF package. Thus the three-dimensional configuration internal to the package is an important factor in designing it.

FIG. 6 shows an exemplary configuration of a conventional RF package. Such RF packages are disclosed, for example, in Japanese Patent Laying-Open Nos. 08-018001 and 10-079623.

In this RF package, a RF semiconductor chip 30 with a RF circuit 32 formed on a semiconductor substrate 31 is fixed on an upper surface of a wiring substrate 10 via conductive paste 61. Chip 30 is fixed faceup, i.e., a surface thereof opposite to the surface bearing RF chip circuit 32 faces wiring substrate 10. Chip RF circuit 32 is connected via a wire 41 to a RF substrate circuit 12 of wiring substrate 10. The space in which RF semiconductor chip 30 is provided on wiring substrate 10 is sealed by a metal cap 57 for shielding electromagnetic waves.

FIG. 7 shows another exemplary configuration of a conventional RF package. It differs from the FIG. 6 configuration in that RF semiconductor chip 30 is connected to RF substrate circuit 12 of wiring substrate 10 via a bump 40 such that a surface bearing RF chip circuit 32 faces wiring substrate 10, i. e., facedown.

The FIG. 6 example, however, does not give any consideration to how the size of the space sealed by the cap affects electromagnetic-wave resonance and the like. Consequently, a large number of waveguide modes are created in the space at an frequency band applied and unnecessary electromagnetic waves leaking from RF chip circuit 32, RF substrate circuit 12, wire 14 and other components cause a large number of resonance in the space, resulting in significantly degraded RF characteristics.

Particularly, wire 41 can be a major cause of unnecessary electromagnetic waves, since it is difficult for wire 41 to achieve RF-matching due to its high inductance. Furthermore, with RF semiconductor chip 30 mounted faceup, the opposing cap's conductor can affect RF chip circuit 32, wire 41 and other components and change their transmission characteristics and the like.

In general the FIG. 7 conventional example generates less unnecessary electromagnetic waves than the FIG. 6 conventional example, since RF semiconductor chip 30 is mounted facedown via bump 40. However, as well as the FIG. 6 conventional example, this conventional example also fails to give consideration as to how the size of the space sealed by the cap affects electromagnetic-wave resonance and the like and a large number of waveguide modes will tend to be created in the space at a frequency band applied. Consequently, unnecessary electromagnetic waves leaking from the RF chip circuit, the RF substrate circuit and other components cause a large number of resonance in the space, resulting in significantly degraded RF characteristics.

The generation of waveguide modes provides a transmission characteristic for small loss and high energy. Thus even if a device with unsealed desirable RF characteristics has been obtained, the RF characteristics will significantly change when the device is sealed. In some cases, no RF characteristics may be obtained, and electromagnetic waves propagated through the space can affect and cause active elements to oscillate and emit heat so that the RF semiconductor chip may be destroyed. Even if it is not significantly degraded, it is necessary to design the RF circuit so that the changed characteristics after the device is sealed are desired characteristics. However, waveguide modes change depending on the arrangement of the RF semiconductor chip and chip parts for matching in the sealed space, the design of the RF substrate circuit, and the like. Accordingly, reviews and modifications are often required in designing a device and this extends the period for development of the device and increases the cost for designing the device.

SUMMARY OF THE INVENTION

One object of the present invention is to provide a miniaturized millimeter wave semiconductor device having a sealing structure capable of electromagnetic shielding, wherein the device has a configuration which exhibit good RF characteristics in a space sealed by a conductive cap for electromagnetic shielding and also introduces reduced RF-characteristic variations caused between before and after the device is sealed so as to allow the device to be readily applied to a variety of packages associated with various product types. Further, the device does not require a long period for development nor high cost.

A millimeter wave semiconductor device of the present invention that achieves the above objective is comprised of a millimeter wave device, a wiring substrate with the millimeter wave device mounted thereto, and a sealing cap including a conductor on a surface thereof for sealing the millimeter wave device. The sealing cap has a ground potential at the conductor provided on a surface thereof and the sealing cap has a form which reduces waveguide modes created in a sealed space for a frequency band applied.

As a specific dimension to reduce the creation of waveguide modes, the spacing between an upper surface of the wiring substrate and an internal surface of the sealing cap is set to less than one fourth of a spatial wavelength of a frequency applied.

In accordance with the present invention, such a configuration can suppress the generation of a multitude of waveguide modes and reduce mutual effects between the sealing cap and each of the wiring substrate and the millimeter wave device, and enhance absorption of unnecessary electromagnetic waves. Thus better RF characteristics can be obtained and they also vary little from the time before to the time after the device is sealed so thus the period for the development and the designing cost can be reduced. These characteristics resulting from the above configuration can be significantly effective in designing and fabricating a RF package accommodating a plurality of high-performance RF semiconductor chips.

When the millimeter wave semiconductor device of the present invention the millimeter wave device is mounted such that the surface of the millimeter wave device that is opposite to the element-bearing surface thereof faces the wiring substrate, it is preferable to set the spacing between the upper surface of the wiring substrate and the internal surface of the sealing cap to at least one hundredth of an effective wavelength at the wiring substrate. Further, and it is also preferable to set the spacing between the element-bearing surface of the millimeter wave device and the internal surface of the sealing cap to at least one hundredth of an effective wavelength at the element-bearing surface of the millimeter wave device.

When in the millimeter wave semiconductor device of the present invention the millimeter wave device is mounted such that the surface of the millimeter wave device that is opposite to the element-bearing surface thereof faces the wiring substrate and an element of the millimeter wave device and the wiring substrate are connected together via connector such as a wire, it is preferable to set the spacing between the connector and the internal surface of the sealing cap to at least one hundredth of an effective wavelength at the connector means.

The spacing thus set between the wiring substrate's upper surface, the millimeter wave device's element-bearing surface or the connector and the sealing cap's internal surface can prevent electromagnetic waves radiated from a RF circuit as the millimeter wave device and a wire as the connector from affecting and destabilizing the potential of the conductive cap and also prevent disturbance of an electromagnetic field at the RF circuit, resulting in further enhanced RF characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
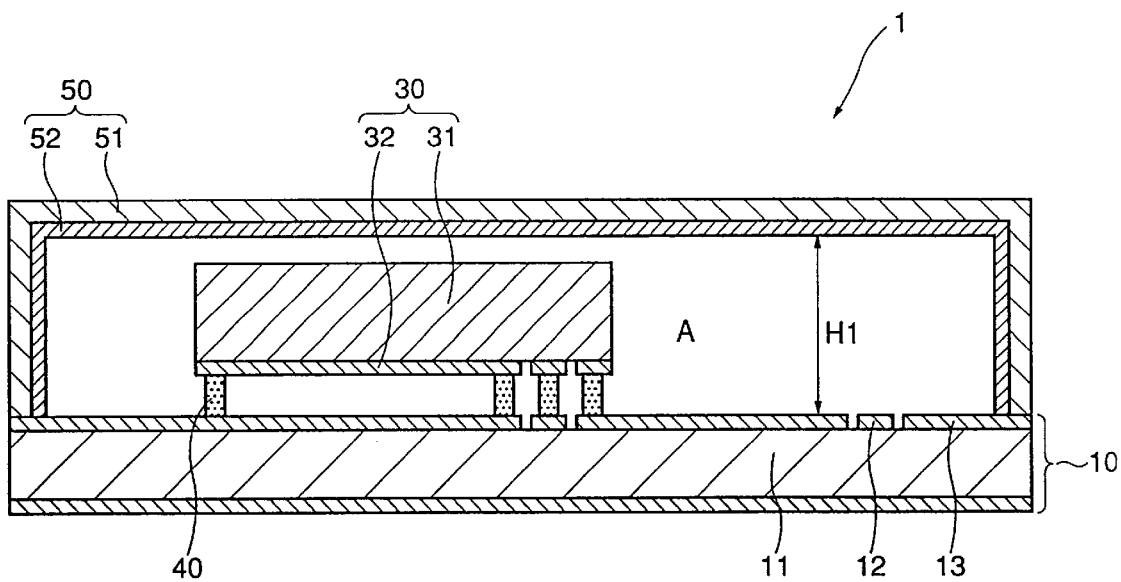
FIG. 1 is a cross section of a millimeter wave semiconductor device of a first embodiment of the present invention.
Figure 2A:
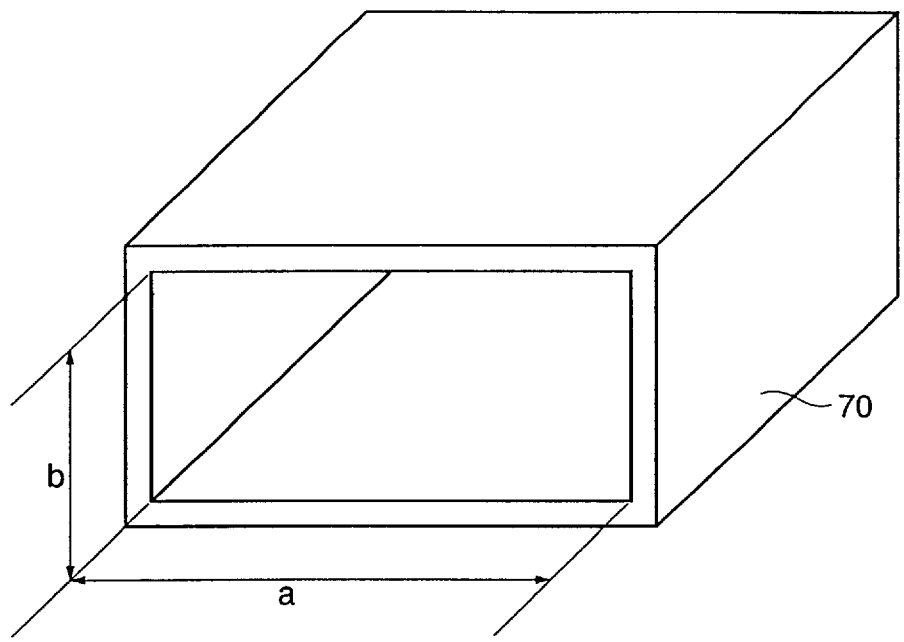
FIG. 2A is a perspective view of a general rectangular waveguide.

A millimeter wave semiconductor device of a first embodiment of the present invention will first be described with reference to FIGS. 1 and 2A and 2B. As shown in FIG. 1, a millimeter wave semiconductor device 1 of the present embodiment is comprised of a wiring substrate 10, a millimeter wave semiconductor chip 30, and a conductive cap 50. Millimeter wave semiconductor chip 30 is mounted face-down at a front surface of wiring substrate 10 and covered by and thus sealed in conductive cap 50. On the front surface of wiring substrate 10 is a RF substrate circuit 12 formed on a substrate base member 11 of ceramic, including a ground 13.

Millimeter wave semiconductor chip 30 is constructed of a semiconductor base member 31 of GaAs and a RF chip circuit 32 formed on semiconductor base member 31 and is reduced in thickness, and wrapped before it is diced. Millimeter wave semiconductor chip 30 is also mounted, flipchip-bonded via a bump 40 of Au, and RF chip circuit 32 and RF substrate circuit 12 are connected together. It should be noted that as RF substrate circuit 12, a coplanar circuit or a microstrip circuit is applied depending on electrical characteristics.

Conductive cap 50 is constructed of a cap base member 51 of ceramic and a conductor 52 covering an internal surface of cap base member 51. Conductor 52 is a good conductor, and in sealing the device conductor 52 is connected to ground 13 and has the same potential as ground 13, shielding electromagnetic waves emitted outwards through the cap and those entering the device through the cap.

It should be noted herein that a spacing H1 from an upper surface of wiring substrate 10 to an internal surface of conductive cap 50 is less than one fourth of a wavelength of an electromagnetic wave in an applied millimeter wave band in a space A formed by wiring substrate 10 and conductive cap 50. Thus the electromagnetic wave is extremely hardly propagated in space A via a waveguide mode. For example, if some unnecessary radiation is caused at a portion of RF substrate circuit 12 the radiation is hardly propagated through space A to another portion, nor affects RF characteristics adversely.

Referring to FIG. 2, a general rectangular waveguide 70 with a longer side a and a shorter side b in a cross section thereof has a characteristic of a high-pass filter, i.e., it does not transmit an electromagnetic wave having a wavelength exceeding twice the longer side a. (A frequency corresponding to the wavelength is a cutoff frequency.) In other words, since the frequency of an electromagnetic wave with a wavelength exceeding twice the longer side a is the cutoff frequency, rectangular waveguide 70 with longer side a of no more than half a wavelength of an electromagnetic wave of a frequency desired to be used cannot propagate the electromagnetic wave of the frequency.

Figure 2B:
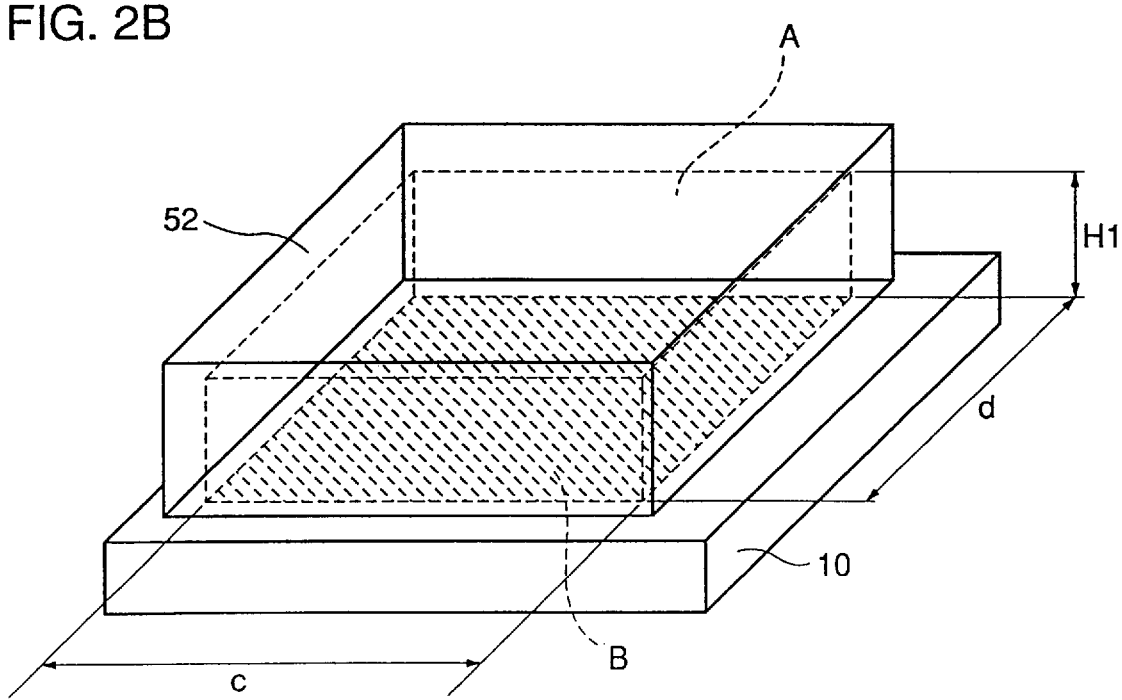
FIG. 2B is a perspective view of the first embodiment when it is regard as a rectangular waveguide.

In the FIG. 1 millimeter wave semiconductor device 1 of the first embodiment, space A, surrounded by conductor 52 of the GND potential, can be regarded as a type of rectangular waveguide, as shown FIG. 2B. For this waveguide, however, a plane region B indicated with broken line hatching in FIG. 2B, a portion of wiring substrate 10 that forms one surface of the waveguide, requires an area for arranging the millimeter wave semiconductor chip, constructing the RF substrate circuit and the like. If at least one of side lengths c and d of plane region B can be half a wavelength in space A, the side can be regarded as longer side a of the FIG. 2A rectangular waveguide 70 and spacing Hi, which is shorter than the side, can be regarded as shorter side b of the FIG. 2A rectangular waveguide 70. Lengths c and d of plane region B set as above theoretically prevent propagation of electromagnetic waves equal to or larger in length than the wavelength in space A.

If a chip is provided with a large number of functions, however, the chip tends to be increased in size. If the size of the chip is not so small in comparison with a wavelength, multiple chips are mounted, or if a matching circuit is constructed at the wiring substrate, then plane region B is relatively increased in size. With the size of plane region B relatively increased, it tends to be difficult to set at least one of side lengths c and d of plane region B to no more than half a wavelength of an electromagnetic wave in space A as the wavelength reduces.

This disadvantage, however, can be addressed by maintaining plane region B of a required size while further reducing spacing H1. More specifically, reduced H1 can increase a cutoff frequency for a waveguide mode and thus degrade the propagation characteristic of the mode and can in particular extremely increase a cutoff frequency, e.g., of a waveguide mode having a uniform electromagnetc field in the H1 direction. It has been found that an appropriate, specific dimension of H1 for a function and configuration which can be put to practical use in a millimeter wave band, is less than one fourth of a wavelength of a frequency applied.

In the first embodiment, the millimeter wave semiconductor chip is 0.25 mm high and spacing H1 is 0.8 mm. These which values are both smaller than one fourth of the length of the spatial wavelength of 60 GHz, i.e., 1.25 mm. In other words, space A having a size hardly allowing the creation of a multitude of waveguide modes of enhanced propagation characteristic can prevent unnecessary electromagnetic waves radiated from RF substrate and chip circuits 12 and 32 and other components from being propagated through space A, so that they may hardly affect RF substrate and chip circuits 12 and 32 and the other components.

According to the first embodiment, millimeter wave semiconductor chip 30 is mounted facedown. Thus, RF chip circuit 32 and conductor 52 of conductive cap 50 hardly affect each other directly. Neither does bump 40 as a connector and conductor 52 of conductive cap 50. Accordingly, only spacing H1 from conductive cap 50 to wiring substrate 10 requires consideration.

Second Embodiment

Figure 3:
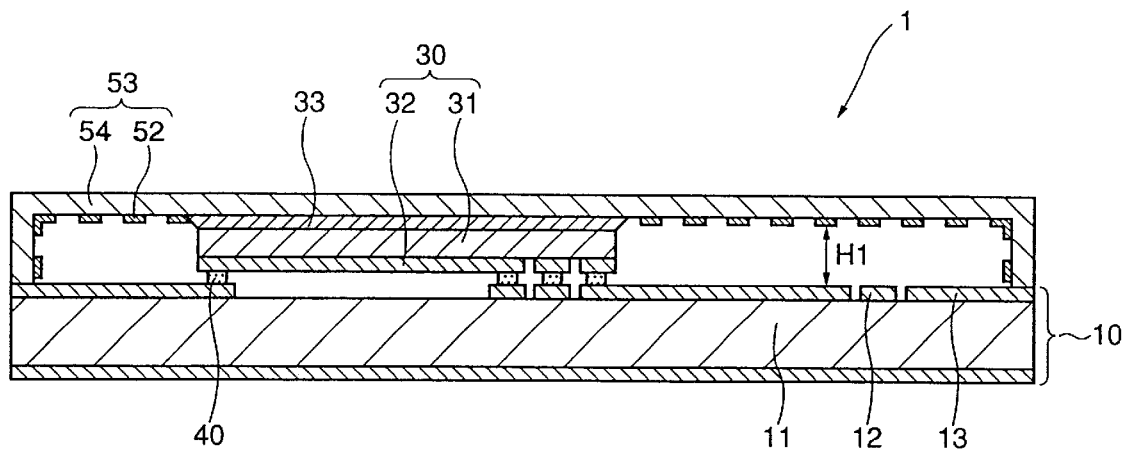
FIGS. 3, 4 and 5 are cross sections of millimeter wave semiconductor devices of second, third and fourth embodiments of the present invention, respectively.

FIG. 3 shows a cross section of a millimeter wave semiconductor device of the second embodiment. It differs in structure from that of the first embodiment shown FIG. 1 only in the following three points: Firstly, conductive cap 50 is replaced by conductive cap 53 of magnetic material for absorbing electromagnetic waves. Secondly, RF chip circuit 32 of millimeter wave semiconductor chip 30 has a rear surface contacting magnetic conductive cap 53 via a buffering member 60. Thirdly, bump 40 is reduced in height and conductor is accordingly not provided in an area 14 of wiring substrate 10 opposite to RF chip circuit 32, except a portion connected by bump 40.

The remainder of the configuration and function that the present embodiment and the first embodiment have in common will not be further described, such as spacing H1 from the upper surface of wiring substrate 10 to the internal surface of magnetic conductive cap 53.

In the configuration of the millimeter wave semiconductor device of the second embodiment, the reduced thickness of millimeter wave semiconductor chip 30 as compared with that of the first embodiment and the insertion of buffering member 60 allow millimeter wave semiconductor chip 30 to be protected against external impact, vibration and the like received by magnetic conductive cap 53 and also allow magnetic conductive cap 53 to be arranged adjacent to the rear surface of millimeter wave semiconductor chip 30. Thus spacing Hi from the upper surface of wiring substrate 10 to the internal surface of conductive cap 50 can further be smaller in the present embodiment than in the first embodiment. This can further increase a frequency at which a waveguide mode is created and thus contribute to prevention of propagation of unnecessary electromagnetic waves.

It should be noted that since any conductor is not provided at area 14 of wiring substrate 10 opposite to RF chip circuit 32, the reduced height of bump 14 does not result in such a disturbance of an electromagnetic field of RF chip circuit 32 that would be caused by a conductor otherwise provided of opposite wiring substrate 10.

Furthermore, buffering member 60 that is conductive and connected to conductor 52 of magnetic conductive cap 53 can contribute to stabilization of rear-surface ground 33 of millimeter wave semiconductor chip 30 as a ground and enhance RF characteristics.

Furthermore, magnetic conductive cap 53 is constructed of a magnetic cap base member 54 with high electromagnetic-wave absorption characteristic and a meshed conductor 52 provided on an internal surface of magnetic cap base member 54. Because of a property of magnetic cap base member 54 itself and the fine unevenness resulting from the meshes of conductor 52, magnetic conductive cap 53 can be enhanced in electromagnetic-wave absorption characteristic, resulting in enhanced RF characteristics.

Third Embodiment

Figure 4:
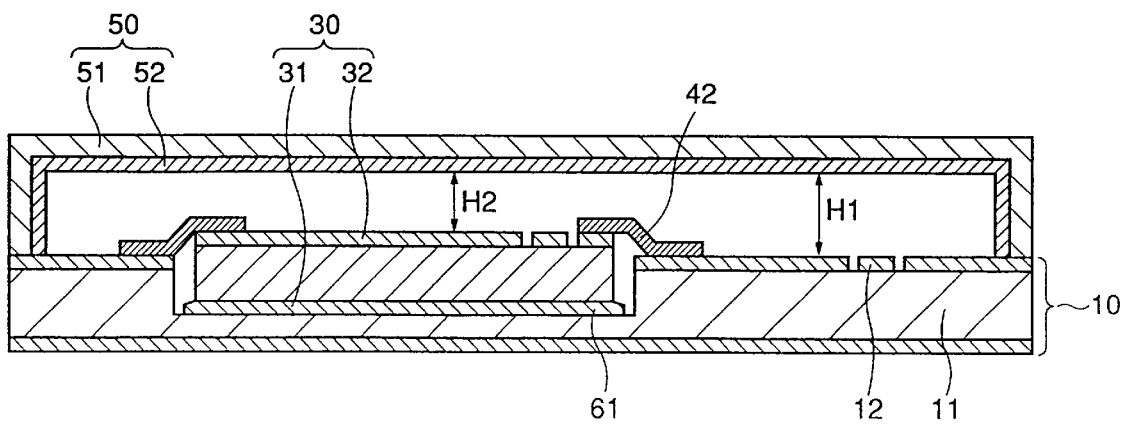

A millimeter wave semiconductor device of a third embodiment of the present invention will now be described with reference to FIG. 4. It differs in configuration to that of the first embodiment shown in FIG. 1 in the following four points: Firstly, wiring substrate 10 is provided with a cavity 15. Secondly, millimeter wave semiconductor chip 30 with RF chip circuit 32 facing upward is dropped into cavity 15 and bonded to a bottom surface of cavity 15 with conductive paste 61. Thirdly RF chip circuit 32 and RF substrate circuit 12 are connected together via a ribbon 42. Fourthly, spacing H1 from wiring substrate 10 and conductive cap 50 is further reduced.

The remainder of the configuration and function that the present embodiment and the first embodiment have in common will not be further described, such as spacing H1 from the upper surface of wiring substrate 10 to the internal surface of magnetic conductive cap 53.

In the configuration of the third embodiment, cavity 15 into which millimeter wave semiconductor chip 30 is dropped allows conductive cap 50 to be closer to wiring substrate 10 and thus spacing Hi to be still smaller than that of the first embodiment. This can further increase a frequency at which a waveguide mode is created and thus contribute to prevention of propagation of unnecessary electromagnetic waves.

If spacing H1 is extremely reduced, however, spacing H2 from the upper surface of RF chip circuit 32 to the internal surface of conductive cap 50 is also reduced. This results in an unstable potential of conductor 52 of conductive cap 50 and a disturbed electromagnetic field of RF chip circuit 32 and hence degraded RF characteristics. Similarly, reduced spacing H1 also results in an unstable potential of conductor 52 of conductive cap 50 and a disturbed electromagnetic field of RF substrate circuit 12 and hence degraded RF characteristics.

Such negative effects as described above attributed to reduced spacings H1, H2 vary depending on the type of transmission line constructing RF chip circuit 32 or RF substrate circuit 12, properties of the substrate, the intensity of a radio frequency applied, and the like. For a transmission line of a configuration and material put to practical use for the millimeter wave range for transmission in a planar direction, spacing H1 may be desirably at least one hundredth of an effective wavelength at RF chip circuit 32 and spacing H2 may be desirably at least one hundiedth of an effective wavelength at RF substrate circuit 12 to prevent such negative effects as described above.

As exemplary dimensions in the configuration of the third embodiment, the millimeter wave semiconductor chip is set to be 0.25 mm high and spacing H2 is set to 0.3 to 0.4 mm.

Fourth Embodiment

Figure 5:
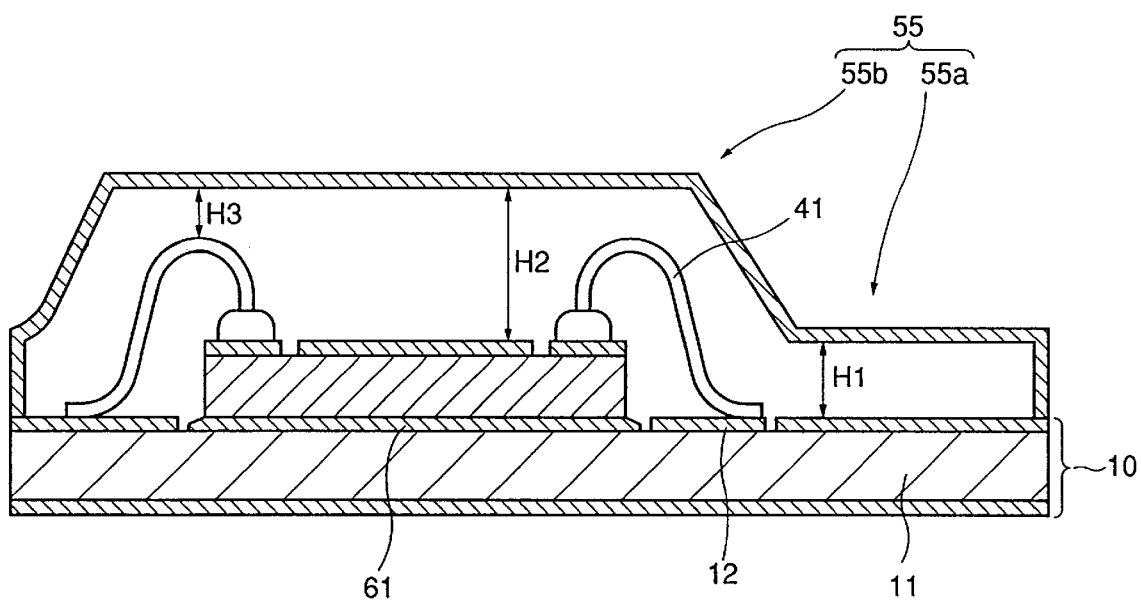
Figure 6:
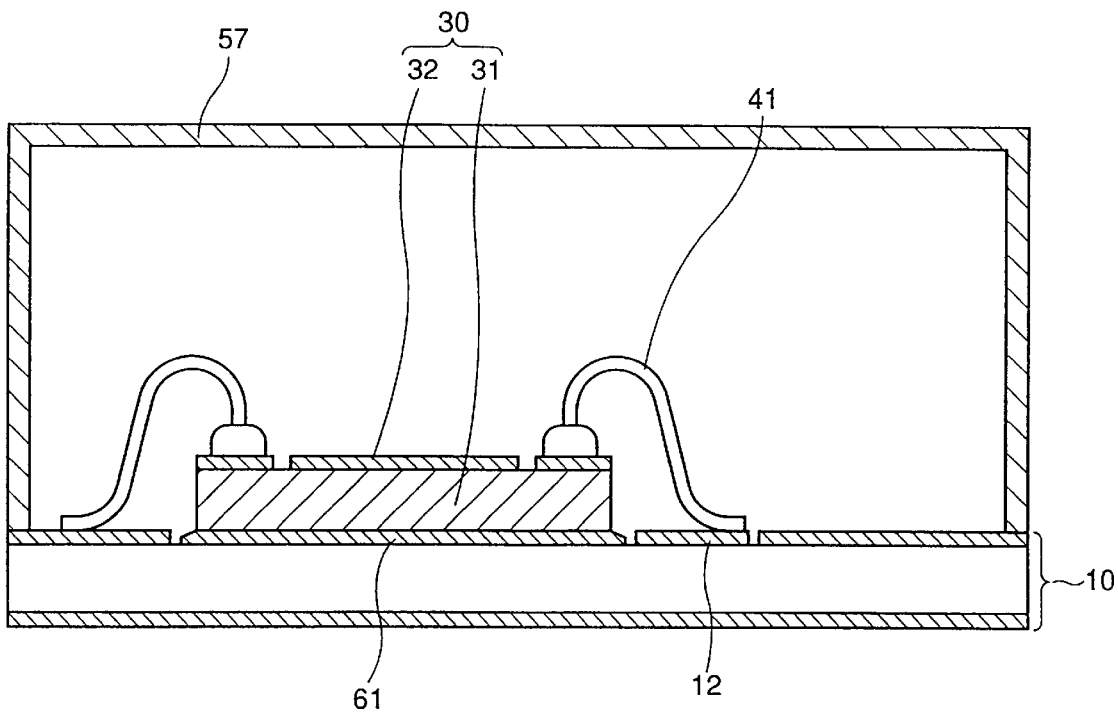
FIG. 6 is a cross section of a conventional RF package.
Figure 7:
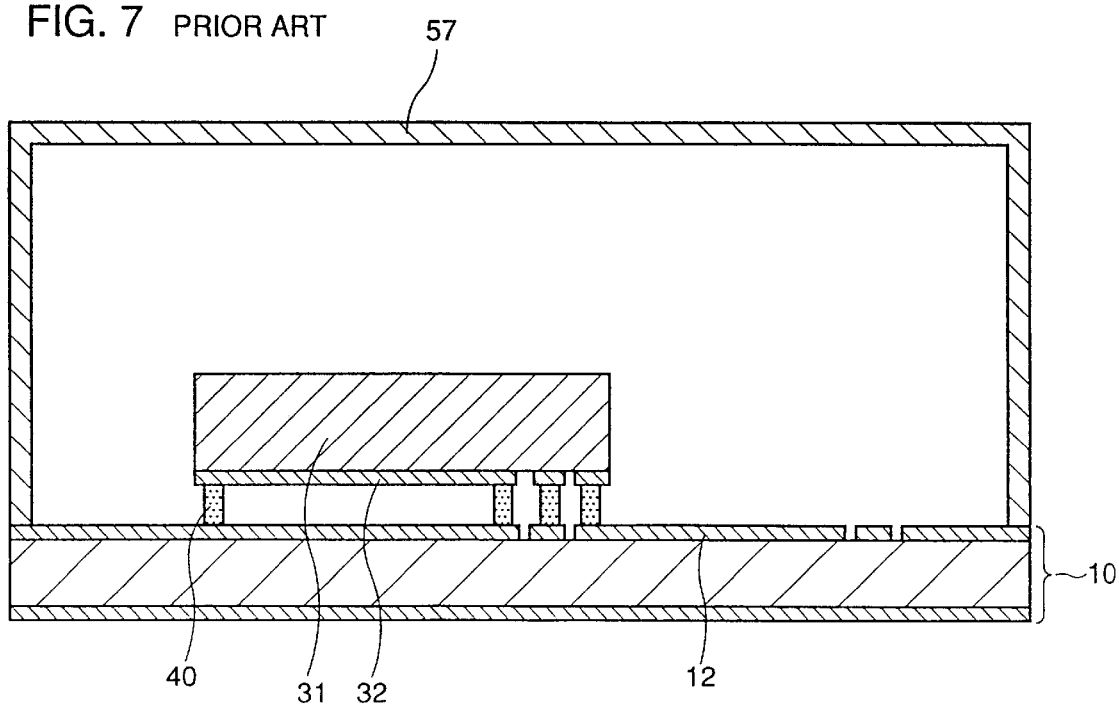
FIG. 7 is a cross section of another conventional RF package.

A millimeter wave semiconductor device of a fourth embodiment of the present invention will now be described with reference to FIG. 5. It differs in configuration from that of the first embodiment shown in FIG. 1 in the following five points: Firstly, wiring substrate 10 is provided with cavity 15. Secondly, millimeter wave semiconductor chip 30 with RF chip circuit 32 arranged on an upper surface thereof, i.e., faceup adheres to an upper surface of wiring substrate 10 via conductive paste 61. Thirdly, RF chip circuit 32 and RF substrate circuit 12 are connected together via a wire 41. Fourthly, a meshed cap 55 is of fine meshes. Fifthly, an upper surface of meshed cap 55 has a relatively high portion 55a and a relatively low portion 55b, providing a step at a border between a region with the mounted chip and the wire therein and other regions.

Accordingly, there will not be described here the remainder of the configuration and function that the present embodiment and the first embodiment have in common, such as spacing Hi from the upper surface of wiring substrate 10 to the internal surface of magnetic conductive cap 53.

With a conductive cap with a flat upper surface, such as illustrated in the first embodiment, used as meshed cap 55, a spacing from wire 41 to meshed cap 55 will further be reduced when spacing H1 from the upper surface of wiring substrate 10 to the internal surface of meshed cap 55 is reduced to prevent propagation of electromagnetic waves to reduce a large number of waveguide modes for a frequency applied. Thus a signal current through wire 41 significantly affectS meshed cap 55 so that a potential of the conductor of the cap is destabilized and an electromagnetic field of the signal through the wire is disturbed, resulting in degraded RF characteristics.

Such disadvantages may be overcome in the millimeter wave semiconductor device of the fourth embodiment by providing a protrusion 55b of meshed cap 55, corresponding to a portion with millimeter wave semiconductor chip 30 therein and corresponding to a portion provided with wire 41. This ensures a spacing H3 from wire 41 to an internal surface of meshed cap 55 to allow good RF characteristics to be maintained. More specifically, spacing H3 of the present embodiment is set to at least one hundredth of an effective wavelength of a radio wave passing through wire 41. Furthermore, spacing H2 from the upper surface of RF chip circuit 32 to the internal surface of meshed cap 55 is also set to at least one hundredth of an effective wavelength of RF chip circuit 32 to prevent RF chip circuit 32 and meshed cap 55 from electromagnetically affecting each other. As dimensions according to the present embodiment, the millimeter wave semiconductor chip is set to be 0.25 mm high, and spacings H2 and H3 are set to 0.5 mm and 0.3 mm, respectively.

It should be noted that meshed cap 55 used as a conductive cap in the present embodiment to readily obtain a desired shape may have its meshes reduced in size to prevent the passage therethrough of electromagnetic waves of an applied frequency to readily ensure electromagnetic-wave shielding characteristic.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A millimeter wave semiconductor device comprising:

a millimeter wave device;

a wiring substrate with said millimeter wave device mounted thereto; and a sealing cap having a surface with a conductor thereon for sealing said millimeter wave device, wherein said sealing cap has a ground potential at said conductor and is shaped so as to prevent creation of a waveguide mode in a sealed space for a frequency applied, wherein said sealing cap includes a meshed conductor having so fine meshes as to prevent an electromagnetic wave of an applied frequency from passing therethrough.

2. A millimeter wave semiconductor device comprising:

a millimeter wave device;

a wiring substrate with said millimeter wave device mounted thereto; and a sealing cap having a surface with a conductor thereon for sealing said millimeter wave device, wherein said sealing cap has a ground potential at said conductor and is shaped so as to prevent creation of a waveguide mode in a sealed space for a frequency applied, and wherein an upper surface of said wiring substrate and an internal surface of said sealing cap are spaced by less than one fourth of a spatial wavelength of a frequency applied, wherein said sealing cap includes a meshed conductor having so fine meshes as to prevent an electromagnetic wave of an applied frequency from passing therethrough.

* * * * *